US010068833B2

(12) United States Patent
Tamaoka et al.

(10) Patent No.: US 10,068,833 B2
(45) Date of Patent: Sep. 4, 2018

(54) HEAT MODULE (71) Applicant: Nidec Corporation, Kyoto (JP)

(72) Inventors: Takehito Tamaoka, Kyoto (JP); Koji Hatanaka, Kyoto (JP); Kiyoto Ida, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 503 days.

(21) Appl. No.: 14/709,803

(22) Filed: May 12, 2015

(65) Prior Publication Data
US 2016/0037683 A1 Feb. 4, 2016

(30) Foreign Application Priority Data

Jul. 29, 2014 (JP) .................................. 2014-153374
Feb. 26, 2015 (JP) .................................. 2015-036423

(51) Int. Cl.
*H05K 7/20* (2006.01)
*H01L 23/467* (2006.01)
*H01L 23/427* (2006.01)
*H01L 23/42* (2006.01)
*H01L 23/367* (2006.01)

(52) U.S. Cl.
CPC .......... *H01L 23/467* (2013.01); *H01L 23/427* (2013.01); *H01L 23/367* (2013.01); *H01L 23/3672* (2013.01); *H01L 23/42* (2013.01); *H01L 2924/0002* (2013.01); *H05K 7/20336* (2013.01)

(58) Field of Classification Search
CPC . H01L 23/427; H01L 23/467; H01L 23/3672; H01L 23/42; H01L 23/367; H01L 2924/0002; H05K 7/20336

USPC ....................................... 165/104.21, 104.33
See application file for complete search history.

(56) References Cited

U.S. PATENT DOCUMENTS

| 6,348,748 | B1 | 2/2002 | Yamamoto | |
| 7,073,568 | B2 * | 7/2006 | Chen | F28D 15/02 165/104.26 |
| 8,157,540 | B2 * | 4/2012 | Aoki | F04D 29/4213 361/695 |
| 2002/0057022 | A1 | 5/2002 | Yamamoto | |

(Continued)

FOREIGN PATENT DOCUMENTS

JP   2000-283089 A   10/2000
JP   2001-57493 A    2/2001

(Continued)

*Primary Examiner* — Jianying Atkisson
*Assistant Examiner* — Joel Attey
(74) *Attorney, Agent, or Firm* — Westerman, Hattori, Daniels & Adrian, LLP (57) ABSTRACT

A heat module includes a fan, a heat sink, a heat transfer member, and a plurality of connection portions. The heat transfer member includes a lower surface capable of being in thermal contact with a heat source, and an upper surface thermally connected to the heat sink, and is arranged to overlap with at least a portion of the fan in a plan view. The plurality of connection portions are arranged between the heat transfer member and the housing to define an axial gap between an upper surface of the heat transfer member and a lower surface of the lower plate portion. The heat transfer member includes a heat source contact portion arranged on a side, closer to the fan, of an end portion of the fan at which the air outlet is defined.

25 Claims, 8 Drawing Sheets

(56) References Cited

U.S. PATENT DOCUMENTS

| | | | | |
|---|---|---|---|---|
| 2007/0131387 A1* | 6/2007 | Kawabata | ............ | F28D 15/0233 |
| | | | | 165/80.3 |
| 2011/0261532 A1* | 10/2011 | Yang | .................. | H01L 23/4006 |
| | | | | 361/697 |
| 2013/0249074 A1* | 9/2013 | Lee | ......................... | H01L 25/16 |
| | | | | 257/713 |

FOREIGN PATENT DOCUMENTS

| JP | 2002-118388 A | 4/2002 |
|---|---|---|
| JP | 2005-321287 A | 11/2005 |
| JP | 2008-103439 A | 5/2008 |

* cited by examiner

HEAT MODULE

BACKGROUND OF THE INVENTION

1. Field of the Invention

The present invention relates to a heat module.

2. Description of the Related Art

A common method to forcibly cool a heat source is to mount a heat sink upon the heat source and cause an air current generated by a cooling fan to strike the heat sink to accomplish air cooling. For example, a heat module as disclosed in JP-A 2008-103439 includes a centrifugal fan, a heat sink, and a heat pipe, and air is caused by rotation of an impeller to strike the heat sink to cool heat transferred from a heat source. However, this method may allow the amount of heat generated from the heat source to exceed the heat capacity of the heat sink, making it impossible to improve an ability to cool the heat source, in the case where the heat source generates a large amount of heat or where the surface area of the heat sink is small.

In recent years, various notebook PCs have been becoming thinner and thinner, with increasing popularity of tablet PCs. If PCs become increasingly thinner, the heat module as described above will not be able to ensure a sufficient thickness of the heat sink and a sufficient surface area of the heat sink. In addition, use of servers has been increasing in volume year after year with the spread of cloud computing. Thus, there have been a demand for space saving regarding spaces in which the servers are installed, and a demand for a reduction in the size of the servers. In recent years, SSDs have often been used in the servers. Systems on a chip (SoCs) used for the SSDs tend to generate an increasingly large amount of heat to increase circuit integration and improve access performance, and when a heat sink having a small thickness is used, the amount of heat generated by the SoC may exceed a heat capacity of the heat sink. If the reduction in the size of the servers progresses, a need will arise to increase the capacity of the SSDs, which will lead to an increased amount of heat generated by the SoCs. If the amount of heat generated by the SoCs further increases, the heat modules will be required to further improve in cooling capabilities.

In view of the above, while there is a need for an increase in the surface area of the heat sink, an improvement in the air volume of a blower fan, and so on, the increase in the surface area of the heat sink runs counter to a reduction in the thickness of a case as described above. Meanwhile, the improvement in the air volume of the blower fan can be accomplished by an increase in the size of the blower fan or an increase in the rotation rate of the blower fan. The increase in the size of the blower fan may make it impossible to install the blower fan in a PC having a small thickness, for example, whereas the increase in the rotation rate of the blower fan may produce a noise problem. Therefore, with a reduction in the thickness of the heat module, a reduction in noise, and so on in view, a novel contrivance is needed regarding a method for heat dissipation.

SUMMARY OF THE INVENTION

A heat module according to a preferred embodiment of the present invention includes a fan, a heat sink, a heat transfer member, and a plurality of connection portions. The fan includes an impeller, a motor, and a housing. The impeller includes a plurality of blades arranged in a circumferential direction about a central axis extending in a vertical direction. The motor is arranged to rotate the impeller. The housing is arranged to accommodate the impeller and the motor, and includes an upper plate portion, a side wall portion, and a lower plate portion. The upper plate portion includes an upper air inlet arranged axially above the impeller. The side wall portion is fixed to a lower surface of the upper plate portion, and includes an air outlet passing through the side wall portion and facing radially outward. The lower plate portion is fixed to a lower portion of the side wall portion. The heat sink includes a plurality of fins, and is arranged radially outside of the air outlet. The heat transfer member includes a lower surface capable of being in thermal contact with a heat source, and an upper surface thermally connected to the heat sink, and is arranged to overlap with at least a portion of the fan in a plan view. The plurality of connection portions are arranged between the heat transfer member and the housing to define an axial gap between an upper surface of the heat transfer member and a lower surface of the lower plate portion. The heat transfer member includes a heat source contact portion arranged on a side, closer to the fan, of an end portion of the fan at which the air outlet is defined.

The heat module according to the above preferred embodiment of the present invention is able to achieve improved cooling performance.

The above and other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
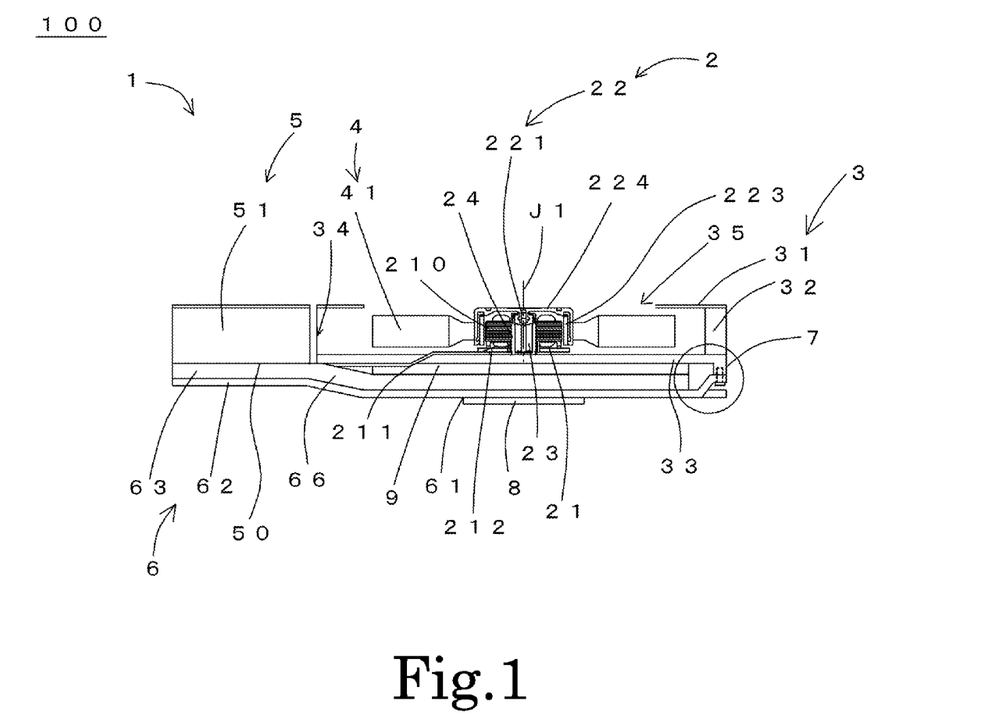
FIG. 1 is a cross-sectional view of a heat module 100 according to a first preferred embodiment of the present invention.

It is assumed herein that an upper side and a lower side in an axial direction parallel to a central axis of a fan 1 of a heat module 100 in FIG. 1 are referred to simply as an upper side and a lower side, respectively. Note that a vertical direction assumed herein may not necessarily correspond with a vertical direction of the heat module 100 when the heat module 100 has been actually installed in a device. It is also assumed herein that a circumferential direction about the central axis is referred to simply by the term "circumferential direction", "circumferential", or "circumferentially", and that radial directions centered on the central axis are referred to simply by the term "radial direction", "radial", or "radially".

FIG. 1 is a cross-sectional view of the heat module 100 according to a first preferred embodiment of the present invention. The heat module 100 includes the fan 1, which is arranged to blow air in a predetermined direction, a heat sink 5, a heat transfer member 6, and a plurality of connection portions 7. The heat module 100 is used, for example, to cool electronic components in connection with a solid-state drive (SSD) on a surface of which a system on a chip (SoC), which is a heat source, or another electronic component, which is a heat-radiating component, is arranged. The fan 1 is a centrifugal fan.

The fan 1 includes a motor 2, a housing 3, and an impeller 4. The motor 2 is arranged to rotate the impeller 4 about a central axis J1. The housing 3 is arranged to accommodate the motor 2 and the impeller 4. The impeller 4 includes a plurality of blades 41 arranged in a circumferential direction about the central axis J1 extending in a vertical direction.

The motor 2 is an outer-rotor motor. The motor 2 includes a stationary portion 21, which is a stationary assembly, a rotating portion 22, which is a rotating assembly, and a sleeve 23, which is a bearing. The sleeve 23 is substantially cylindrical, and is centered on the central axis J1. The rotating portion 22 is supported by the sleeve 23 to be rotatable about the central axis J1 with respect to the stationary portion 21.

The stationary portion 21 includes a stator 210, a bearing holding portion 24, a circuit board 211, and a lead wire 212. The bearing holding portion 24 is arranged to accommodate the sleeve 23. The bearing holding portion 24 is substantially cylindrical, is centered on the central axis J1, and is made of a resin. The bearing holding portion 24 is arranged to project upward from a substantial center of a lower plate portion 33 described below. The bearing holding portion 24 is fixed in a hole portion (not shown) defined in the lower plate portion 33. A lower end portion of the bearing holding portion 24 and a portion of the lower plate portion 33 around the hole portion (not shown) are joined to each other through insert molding.

The stator 210 is annular, is centered on the central axis J1, and is attached to an outside surface of the bearing holding portion 24. The stator 210 includes a stator core (not shown) and a plurality of coils (not shown). The circuit board 211 is electrically connected to the stator 210. The lead wire 212 is arranged to supply power to the circuit board 211.

The rotating portion 22 includes a shaft 221, a rotor magnet 223, and a cup 224. The cup 224 is substantially in the shape of a covered cylinder and centered on the central axis J1. The cup 224 is arranged to be open downwardly. The shaft 221 is centered on the central axis J1, and an upper end portion of the shaft 221 is fixed to the cup 224. The rotor magnet 223 is substantially cylindrical, is centered on the central axis J1, and is fixed to an inside surface of the cup 224.

The shaft 221 is inserted in the sleeve 23. The sleeve 23 is defined by an oil-bearing porous metal body, and is inserted and fixed in the bearing holding portion 24. Note that a ball bearing, for example, may be used as a bearing mechanism.

The housing 3 includes an upper plate portion 31, a side wall portion 32, and the lower plate portion 33. The upper plate portion 31 includes one upper air inlet 35 arranged axially above the impeller 4. The side wall portion 32 is fixed to a lower surface of the upper plate portion 31, and includes an air outlet 34 passing therethrough and facing radially outward. The side wall portion 32 is arranged to cover a lateral side of the impeller 4. The side wall portion 32 includes a tongue portion (not shown) arranged to project between the air outlet 34 and the impeller 4. The lower plate portion 33 is fixed to a lower portion of the side wall portion 32. The stationary portion 21 is fixed to the lower plate portion 33. The lower plate portion 33 is arranged to be in contact with the side wall portion 32, and is arranged to support the impeller 4 through the motor 2 such that the impeller 4 is rotatable. The upper plate portion 31, the side wall portion 32, and the lower plate portion 33 are arranged to together define an air channel portion (not shown) which surrounds the impeller 4.

The upper plate portion 31 includes the upper air inlet 35 arranged above the impeller 4, and passing therethrough in the vertical direction. The upper air inlet 35 is arranged to axially overlap with at least a portion of the motor 2 or the entire motor 2 in a plan view. The upper air inlet 35 is substantially circular, and the central axis J1 passes therethrough. At least one pair of adjacent ones of the blades 41 are arranged to define a channel therebetween, the channel joining a space axially above the blades 41 and a space between the blades 41 and the lower plate portion 33 to each other in an axial direction. The channel is arranged to be open toward an upper surface of the lower plate portion 33. Thus, an air sucked through the upper air inlet 35 passes between the adjacent blades 41 of the impeller 4 toward the lower plate portion 33. Rotation of the impeller 4 causes the air sent toward the lower plate portion 33 to be sent in a centrifugal direction and discharged through the air outlet 34.

The lower plate portion 33 is a substantially plate-shaped member produced by subjecting a metal sheet to press working. According to the present preferred embodiment, the lower plate portion 33 is made of a material having excellent thermal conductivity. For example, the lower plate portion 33 is made of an aluminum alloy and is molded by die casting. The side wall portion 32 is made of an aluminum alloy, and is molded by die casting. Alternatively, the side wall portion 32 may be molded of a resin. A lower end portion of the side wall portion 32 and an edge portion of the lower plate portion 33 are fastened to each other by, for example, screws. The upper plate portion 31 is fixed to an upper end portion of the side wall portion 32 by, for example, screws or crimping. Although the air inlet is included only in the upper plate portion 31 according to the present preferred embodiment, the air inlet may be included in each of the upper plate portion 31 and the lower plate portion 33. Details thereof will be described below.

Note that, in the case where a cover of a case or the like is arranged above the upper plate portion 31, and an axial distance between the upper plate portion 31 and the cover is extremely small, so that sufficient air cannot be sucked in through the upper air inlet 35 defined in the upper plate portion 31, the air inlet may be defined only in the lower plate portion 33.

The upper plate portion 31, the side wall portion 32, and the lower plate portion 33 are arranged to together define the air outlet 34 on the lateral side of the impeller 4. The air outlet 34 is arranged to open radially outwardly in the housing 3.

The impeller 4 includes the plurality of blades 41. The blades 41 are arranged in an annular shape with the central axis J1 as a center radially outside of the cup 224. A radially inner end portion of each blade 41 is fixed to an outside surface of the cup 224. A torque centered on the central axis J1 is produced between the rotor magnet 223 and the stator 210 as a result of supply of electric currents to the stationary portion 21. The impeller 4 is thus caused to rotate about the central axis J1 together with the rotating portion 22. The rotation of the impeller 4 causes air to be drawn into the housing 3 through the upper air inlet 35, and to be sent out through the air outlet 34.

Figure 4:
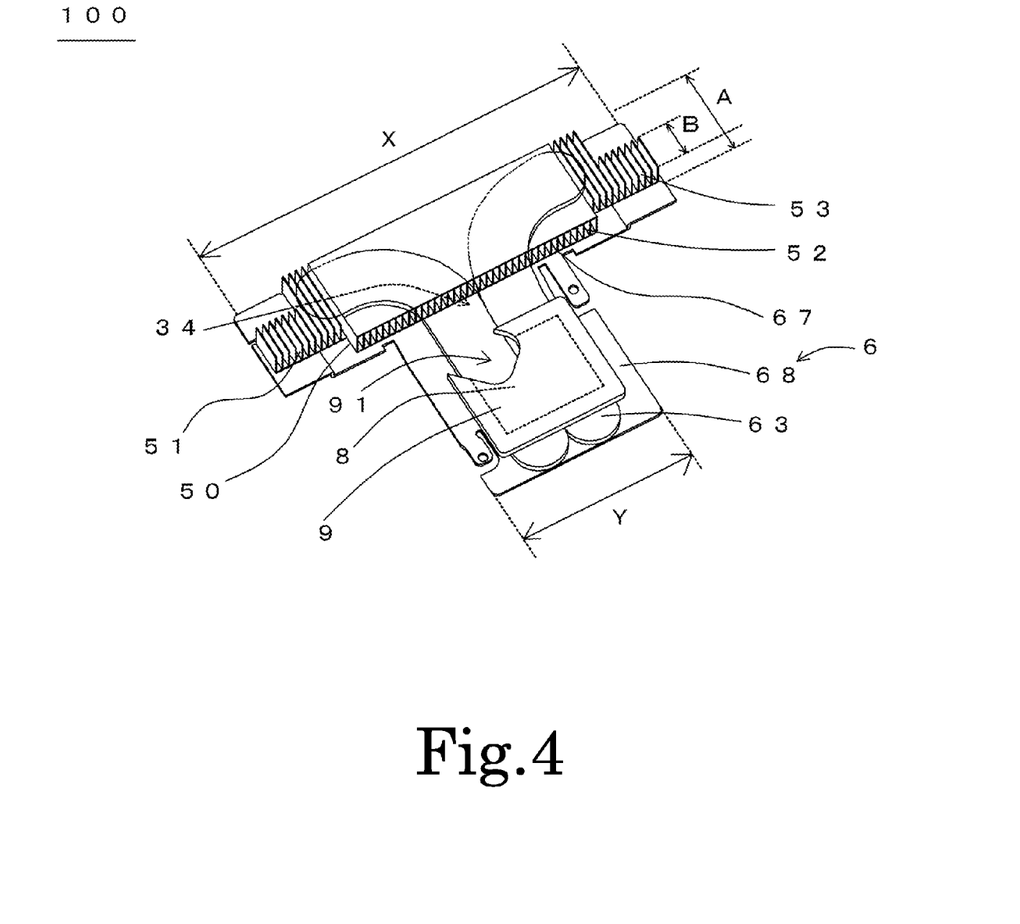
FIG. 4 is a perspective view of the heat module 100 according to the first preferred embodiment of the present invention with a fan 1 removed therefrom.

The heat sink 5 is arranged radially outside of the air outlet 34. Referring to FIG. 4, the heat sink 5 includes a heat sink base portion 50 and a plurality of fins 51 each of which is arranged to extend axially upward from an upper surface of the heat sink base portion 50. The fins 51 are a plurality of heat dissipating fins arranged in parallel with one another, each heat dissipating fin being substantially in the shape of the letter "U" and including an upper surface portion, a vertical surface portion, and a bottom surface portion, for example. With the fins 51 being arranged in parallel with one another, the upper surface portion, the bottom surface portion, and the vertical surface portion of each fin 51 and the vertical surface portion of an adjacent one of the fins 51 together define a passage having a rectangular cross section. Referring to FIG. 1, wind discharged by the fan 1 through the air outlet 34 passes through the heat sink 5 and absorbs heat of the fins 51 to accomplish cooling. An upper surface of the lower plate portion 33 is arranged at a level higher than that of a root of each of the fins 51. Moreover, a lower end of each of the blades 41 of the impeller 4 is arranged at a level higher than that of the root of each of the fins 51.

The heat transfer member 6 includes a heat source contact portion 61 arranged on a side, closer to the fan 1, of an end portion of the fan 1 at which the air outlet 34 is defined. A lower surface of the heat transfer member 6 is capable of being in thermal contact with a heat source 8, while an upper surface of the heat transfer member 6 is thermally connected to the heat sink 5. The heat transfer member 6 is arranged to overlap with at least a portion of the fan 1 in a plan view. In other words, the heat transfer member 6 includes a first heat dissipating upper surface (not shown) arranged to transfer heat of the heat source 8 located below the fan 1 toward the fan 1, that is, upward, through air or a thermal member, and a second heat dissipating upper surface (not shown) arranged to transfer the heat toward the heat sink 5.

According to the present preferred embodiment, the heat transfer member 6 includes a base portion 62 and two heat pipes 63. A lower surface of the base portion 62 includes the heat source contact portion 61, which is arranged to be in contact with the heat source 8. Each heat pipe 63 is arranged axially above the base portion 62. One end portion of each heat pipe 63 is arranged to be in thermal contact with the heat source contact portion 61. An upper surface of an opposite end portion of each heat pipe 63 is arranged to be in thermal contact with the heat sink 5. The heat transfer member 6 includes, between the central axis J1 and the heat sink 5, a shoulder portion 66 with an end thereof on a side closer to the heat sink 5 being higher than an opposite end thereof. A lower surface of each heat pipe 63 is preferably fixed to an upper surface of the base portion 62 through a solder. Note that the lower surface of each heat pipe 63 may alternatively be arranged to be in thermal contact with the upper surface of the base portion 62 through a plastic thermally conductive material, such as, for example, a thermal grease, a compound, or a silicone.

Since the heat pipes 63 are included in the heat transfer member 6, the heat transfer member 6 is able to efficiently absorb heat through the heat source contact portion 61 and dissipate the heat through the heat sink 5.

The heat transfer member 6 is made, for example, of a metal having excellent thermal conductivity, such as copper, aluminum, or the like. The base portion 62 is, for example, made of aluminum and is defined by a cutting process or a die casting process. Each heat pipe 63 is made of a material having a high thermal conductivity, such as copper, aluminum, or the like.

The heat source contact portion 61 is arranged in the lower surface of the base portion 62. The heat source contact portion 61 of the base portion 62 is subjected to a cutting process and a grinding process, for example. In this case, a surface of the heat source contact portion 61 has a small degree of surface roughness. That is, the base portion 62 is in contact with the heat source 8 with a high contact pressure. Transfer of heat from the heat source 8 to the base portion 62 can be accomplished with a low thermal resistance when the heat source contact portion 61 has a high contact pressure, a small degree of surface roughness, and a large surface area. If each heat pipe 63 is arranged to be in direct contact with the heat source 8, the contact pressure can be higher, but it will be difficult to increase an area of contact between the heat pipe 63 and the heat source 8. Each heat pipe 63 includes a hollow tube made of a material having a high thermal conductivity, such as, for example, copper or aluminum, and a capillary structure and a working fluid arranged in the hollow tube. When a surface of the heat pipe 63 is subjected to a grinding process, a pressure is applied to the surface of the heat pipe 63. The pressure applied to the surface of the heat pipe 63 may deform the capillary structure arranged in the hollow tube of the heat pipe 63, and may thus reduce heat dissipation performance of the heat pipe 63. Therefore, it is difficult to reduce the degree of surface roughness of the surface of the heat pipe 63. In short, when the base portion 62 is arranged to be in contact with the heat source 8, a smaller value of the thermal resistance can be achieved, and as a result, the heat dissipation performance can be improved.

The plurality of connection portions 7 are arranged between the heat transfer member 6 and the housing 3 to define an axial gap between the upper surface of the heat transfer member 6 and a lower surface of the lower plate portion 33. The connection portions 7 are arranged radially outward of an inner circumferential surface of the side wall portion 32, and are spaced from one another in the circumferential direction. According to the first preferred embodiment, the heat transfer member 6 includes a plurality of seating surface portions 64 (see FIG. 2), which are the plurality of connection portions 7, each of which is arranged to project axially upward.

Heat generated at the heat source 8 is not only transferred to the heat sink 5, but is also dissipated before it reaches the heat sink 5 along a path leading to the heat sink 5. For example, in the case where the distance between the heat source 8 and the heat module 100 in the case is great, the heat source 8 and the heat sink 5 may be connected to each other through the heat pipes 63, so that the heat can be dissipated through the heat pipes 63 while the heat is transferred from the heat source 8 to the heat sink 5. However, only a limited improvement in the heat dissipation performance can be achieved by natural heat dissipation through the heat pipes 63 or by simply exposing the heat pipes 63 to air. Accordingly, the heat sink 5 and the blower fan 1 are arranged on the heat transfer member 6. The blower fan 1 is arranged to axially overlap with the heat source 8. The heat generated at the heat source 8 is transferred to the heat sink 5 through the heat transfer member 6. The heat transferred to the heat sink 5 is air-cooled by the blower fan 1. In addition, the axial gap is defined between the heat transfer member 6 and the blower fan 1. When the axial gap is provided, the heat generated at the heat source 8 is able to reach the axial gap through the heat transfer member 6. There are two types of methods to dissipate the heat using the axial gap.

A first method is to arrange a thermally conductive member 9 in the axial gap to allow the heat to be directly transferred to the housing 3 of the blower fan 1. An air current generated by the rotation of the impeller 4 constantly circulates inside the blower fan 1, and the heat is thus dissipated inside the blower fan 1. A second method is to define a lower air inlet in the blower fan 1 at a position opposite to the axial gap to allow air in the axial gap to be moved by air sucked up through the lower air inlet so that air circulation can occur in the axial gap to dissipate the heat transferred from the heat source 8.

The dimension of the axial gap is important for each of the above two methods. For example, in the case of the first method, it is necessary to reduce thermal resistance between the heat transfer member 6 and the thermally conductive member 9 and between the thermally conductive member 9 and the blower fan 1. A reduction in the thermal resistance requires increasing contact pressure between the opposing members. An excessive increase in the contact pressure causes a deformation of the opposing members and a reduction in the area of contact between the opposing members, resulting in an increase in the thermal resistance. Therefore, it is necessary to set an appropriate contact pressure, and it is necessary to set the dimension of the axial gap with high precision. In the case of the second method, it is necessary to cause the air to pass a surface of the heat transfer member 6. The air is viscous, and the air tends to stay on the surface of the heat transfer member 6. Thus, the air staying on the surface of the heat transfer member 6 cannot be caused to move only by air passing in the vicinity of the heat transfer member 6. In order to cause the air staying on the surface of the heat transfer member 6 to move, a distance between the blower fan 1 and the heat transfer member 6, that is, the dimension of the aforementioned axial gap, needs to be reduced. A reduction in the dimension of the axial gap makes it easier for the air staying on the surface of the heat transfer member 6 to move. This leads to increased dissipation of heat from the heat transfer member 6. Meanwhile, an excessive reduction in the dimension of the axial gap may result in a reduction in the volume of air sucked up through the lower air inlet, resulting in a reduction in the volume of air passing through the axial gap. Therefore, it is necessary to set the dimension of the axial gap with high precision.

When the plurality of connection portions 7 are arranged between the fan 1 and the heat transfer member 6, precision of the dimension of the aforementioned axial gap can be improved. For example, when the number of connection portions 7 is three, lower surfaces of the three connection portions 7 define surfaces which are substantially flush with a plane perpendicular to the central axis J1. A variety of arrangements of the connection portions 7 are conceivable, but the connection portions 7 are primarily defined by molding using a mold. In the case where the connection portions 7 are defined by molding using the mold, when removal from the mold is completed, the lower surface of each connection portion 7 is substantially flush with the plane perpendicular to the central axis J1, and it is easy to control the height of each connection portion 7 at the time of inspection. This makes it less likely for a circumferential portion of the blower fan 1 to be tilted, and facilitates precise axial dimension control. Meanwhile, in the case where no connection portions 7 are provided, and height control is carried out only with a lower surface of a base or the upper surface of the heat transfer member 6, it will be difficult to identify portions which are to be measured at the time of inspection, and the blower fan 1 may become tilted with respect to the heat transfer member 6 when the level of a point which is not measured is extremely high or low. The tilting of the blower fan 1 means that the dimension of the aforementioned axial gap is not even, and that the dimension of the aforementioned axial gap is not set with high precision.

The heat transfer member 6 includes, between the central axis J1 and the heat sink 5, the shoulder portion 66 which is higher on the side closer to the heat sink 5. The shoulder portion 66 is preferably arranged radially outward of inner ends of the blades 41. In this case, a lower end of an outer end of the fan 1 on a side where the heat sink 5 is arranged is in contact with an upper surface of each heat pipe 63 of the heat transfer member 6. Meanwhile, a lower end of an outer end of the fan 1 on an opposite side is in contact with the upper surface of the heat pipe 63 of the heat transfer member 6 through the connection portion(s) 7. Thus, a space is defined between the lower surface of the lower plate portion 33 and the upper surface of the heat transfer member 6 to make it possible to arrange the thermally conductive member 9 between the lower surface of the lower plate portion 33 and the upper surface of the heat transfer member 6. Accordingly, heat transferred from the heat source 8 to the heat transfer member 6 is transferred to the fan 1 through the thermally conductive member 9, and is discharged through the air outlet 34 by the air current generated by the rotation of the impeller 4. Thus, a heat dissipation effect produced by the heat pipes 63 is improved.

Note that, in the case where both the upper air inlet 35 and the lower air inlet are provided, provision of the space between the lower surface of the lower plate portion 33 and the upper surface of the heat transfer member 6 increases the amount of air sucked in through the lower air inlet. Thus, the amount of air discharged through the air outlet 34 by the impeller 4 is increased, resulting in an improvement in the heat dissipation effect produced by the heat pipes 63.

The heat sink 5 includes the plurality of fins 51 and the heat sink base portion 50 (see FIG. 4) arranged to support the fins 51. The lower end of each of the blades 41 is arranged at a level higher than that of the upper surface of the heat sink base portion 50. After an air current generated by rotation of the blades 41 is discharged through the air outlet 34, air of the air current diffuses both upward and downward in the axial direction. In particular, in the case where the air inlet is provided only on the upper side, or in the case where the area of an opening of the upper air inlet 35 is greater than the area of an opening of the lower air inlet, the amount of air which diffuses downward in the axial direction is increased. When the lower end of each blade 41 is arranged at a level higher than that of the heat sink base portion 50, interference of air of the air current which diffuses away from the blades 41 with an edge of the heat sink base portion 50 on a side closer to the fan 1 is reduced, and thus, a cooling effect is improved while reducing an increase in a noise level. The temperature of the heat sink 5 is highest at the heat sink base portion 50, and the temperature can be decreased with decreasing distance from an upper end of each fin 51. The present arrangements enable a large amount of air to be supplied to an area near a joint between each fin 51 and the heat sink base portion 50, to exhibit high cooling performance.

The upper surface of the lower plate portion 33 is arranged at a level higher than that of the upper surface of the heat sink base portion 50. The air current generated by the rotation of the blades 41 passes along the upper surface of the lower plate portion 33, and is discharged through the air outlet 34 toward the heat sink 5. That is, when the upper surface of the lower plate portion 33 is arranged at a level higher than that of the upper surface of the heat sink base portion 50, interference of the air current with the edge of the heat sink base portion 50 on the side closer to the fan 1 is reduced, and thus, the cooling effect is improved while reducing the increase in the noise level.

Figure 2:
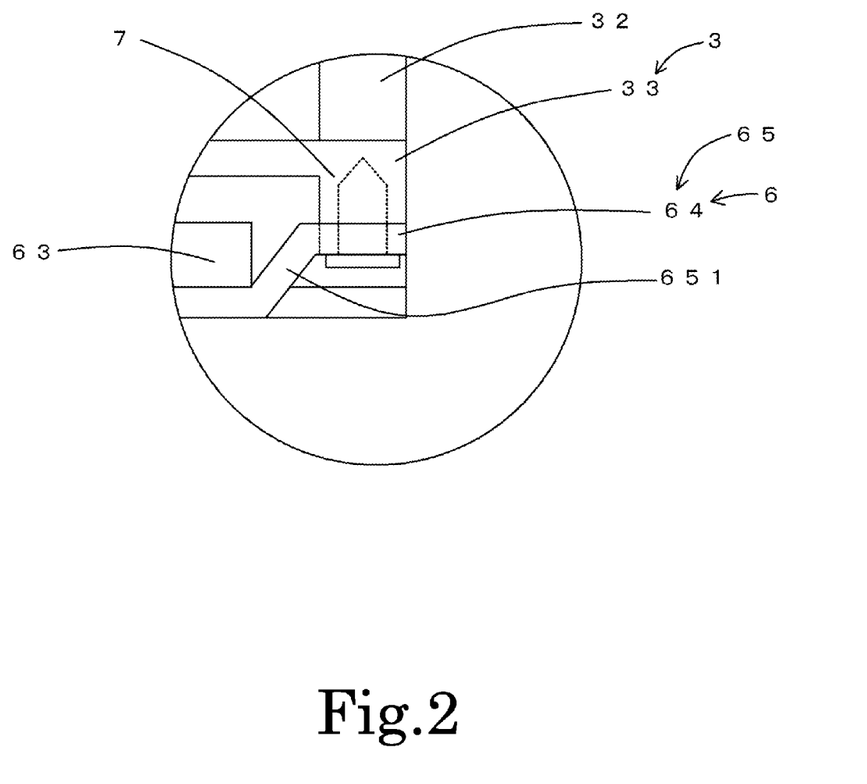
FIG. 2 is a cross-sectional view illustrating a connection portion 7 and its vicinity according to the first preferred embodiment in an enlarged form.

FIG. 2 is a cross-sectional view illustrating one of the connection portions 7 and its vicinity according to the first preferred embodiment in an enlarged form. Referring to FIG. 2, the plurality of connection portions 7 include the plurality of seating surface portions 64 each of which is arranged to project axially upward from the heat transfer member 6, and the fan 1 is arranged on the plurality of seating surface portions 64. In more detail, each seating surface portion 64 is arranged to extend axially upward from a radially outer end portion of the base portion 62 of the heat transfer member 6. An upper surface of each seating surface portion 64 is arranged to be in contact with the lower surface of the lower plate portion 33 of the housing 3. The fan 1 and the heat transfer member 6 are fastened to each other using fitting members, such as, for example, screws.

The fitting members, such as, for example, the screws, are used to fasten the fan 1 and the heat transfer member 6 to each other. Because a downward projection of a lower end of each screw below the heat transfer member 6 can be avoided, the axial height of the heat module 100 can be reduced. Moreover, surfaces of contact between the fan 1 and the heat transfer member 6 can be elevated. This makes it possible to reduce the length of each screw. Note that each screw may alternatively be inserted from the fan 1 downward. In this case, the screw needs to reach the heat transfer member 6 passing through the contact surface. Note that members defining the connection portions 7 and the method of fastening the fan 1 and the heat transfer member 6 to each other may be modified in a variety of manners.

Referring to FIG. 2, the base portion 62 includes raised portions 65. Each raised portion 65 includes a bend portion 651 and the seating surface portion 64. The bend portion 651 is defined integrally with the base portion 62, and is bent axially upward in the vicinity of a radially outer end of the base portion 62. The seating surface portion 64 is arranged to extend from an upper end of the bend portion 651 in a direction perpendicular to the axial direction. The raised portion 65 is joined to the lower surface of the lower plate portion 33 of the housing 3. In more detail, the upper surface of the seating surface portion 64 is fastened to the lower surface of the lower plate portion 33 through the fitting member, such as, for example, the screw.

Provision of the raised portions 65 makes it possible to define the seating surface portions 64 without increasing the weight of the base portion 62 of the heat transfer member 6, and to define the connection portions 7 which define the axial gap between the fan 1 and the heat transfer member 6.

Figure 3:
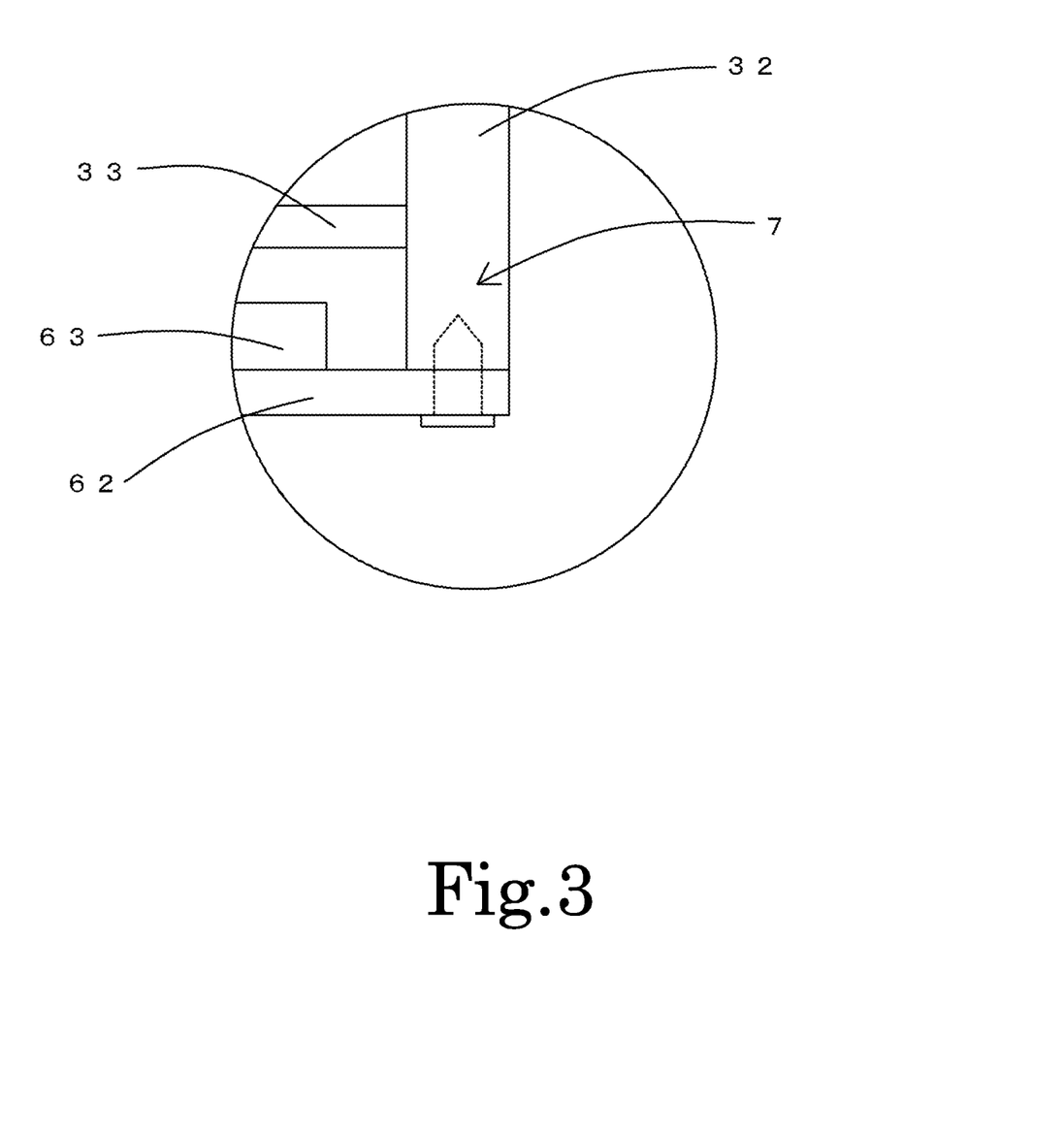
FIG. 3 is a cross-sectional view illustrating a connection portion 7 and its vicinity according to another preferred embodiment of the present invention in an enlarged form.

FIG. 3 is a cross-sectional view illustrating a connection portion 7 and its vicinity according to another preferred embodiment of the present invention in an enlarged form. Referring to FIG. 3, the connection portion 7 is defined integrally with a side wall portion 32, and is arranged to extend axially downward from a lower end of the side wall portion 32. Then, a lower surface of the side wall portion 32 is fastened to an upper surface of a base portion 62 through a fitting member, such as, for example, a screw. The lower surface of the side wall portion 32 abuts on an upper surface of a lower plate portion 33 over an area where the lower surface of the side wall portion 32 does not axially overlap with any connection portion 7.

Referring to FIG. 1, the dimension of the axial gap between an upper end surface of each heat pipe 63 and the lower surface of the lower plate portion 33 is smaller than the sum of the axial height of the base portion 62 and the axial height of the heat pipe 63. In other words, the dimension of the axial gap between the upper surface of the heat transfer member 6 and the lower surface of the lower plate portion 33 is smaller than a maximum thickness of the heat transfer member 6. Thus, a reduction in the dimension of the axial gap between an upper end surface of the heat transfer member 6 and a lower surface of the housing 3 is achieved while a sufficient heat capacity of the heat transfer member 6 is secured. That is, in the case where the lower air inlet is provided, a channel leading to the lower air inlet can be narrowed to cause a layer of air staying on the surface of the heat transfer member 6 to move when air passes between the upper end surface of the heat transfer member 6 and the lower surface of the housing 3, leading to an improvement in the heat dissipation performance. Meanwhile, in the case where the thermally conductive member 9 is arranged in the axial gap between the upper end surface of the heat transfer member 6 and the lower surface of the housing 3, the thermally conductive member 9 is able to improve the heat dissipation performance more greatly when the thermally conductive member 9 plays the role of transferring heat than when the thermally conductive member 9 plays the role of increasing the heat capacity.

Thus, a space can be defined between the lower surface of the lower plate portion 33 and the upper surface of the heat transfer member 6, and the thermally conductive member 9 can be arranged between the lower surface of the lower plate portion 33 and the upper surface of the heat transfer member 6. Accordingly, heat transferred from the heat source 8 to the heat transfer member 6 is transferred to the fan 1 through the thermally conductive member 9, and is discharged through the air outlet 34 by the rotation of the impeller 4. Thus, cooling performance is improved. Note that the heat transfer member 6 may be arranged to support the fan 1 through only the connection portions 7.

Note that, in the case where both the upper air inlet 35 and the lower air inlet are provided, provision of the space between the lower surface of the lower plate portion 33 and the upper surface of the heat transfer member 6 increases the amount of air sucked in through the lower air inlet. Thus, the amount of air discharged through the air outlet 34 by the impeller 4 is increased, resulting in an improvement in the cooling performance.

The lower plate portion 33 is arranged to be in thermal connection with the heat transfer member 6 through the thermally conductive member 9. In more detail, an upper surface of the thermally conductive member 9 is arranged to be in contact with the lower surface of the lower plate portion 33. A lower surface of the thermally conductive member 9 is arranged to be in contact with the upper surface of the heat transfer member 6. That is, according to the present preferred embodiment, the lower surface of the thermally conductive member 9 is arranged to be in contact with the upper surface of each heat pipe 63.

With the heat source 8 being in direct connection with the lower plate portion 33, the heat of the heat source 8 is transferred to the fan 1 with thermal resistance due to the heat transfer member 6 and the thermally conductive member 9 being the sole resistance. Thus, the heat is efficiently transferred to the fan 1, and is efficiently dissipated.

The thermally conductive member 9 is preferably made of a plastic material. For example, the thermally conductive member 9 may be a thermal sheet, a thermal grease, a compound, or a silicone.

The heat transfer member 6 is defined by a metal sheet. The thermally conductive member 9 may be made of copper, aluminum, or iron. In this case, the thermally conductive member 9 has a high thermal conductivity, and thermal resistance between the heat source 8 and the fan 1 can be reduced to improve the heat dissipation performance. As mentioned above, the heat transfer member 6 is made, for example, of the metal having excellent thermal conductivity, such as copper, aluminum, or the like.

FIG. 4 is a perspective view of the heat module 100 according to the first preferred embodiment of the present invention with the fan 1 removed therefrom. The heat transfer member 6 includes a heat sink mount portion 67 arranged to axially overlap with the heat sink 5, and a fan mount portion 68 arranged to axially overlap with the fan 1. In a plan view, the dimension of the heat sink mount portion 67 measured along the air outlet 34 of the fan 1 is greater than the dimension of the fan mount portion 68 measured along the air outlet 34 of the fan 1. In other words, when x denotes the dimension of the heat sink mount portion 67 measured along the air outlet 34 of the fan 1, and Y denotes the dimension of the fan mount portion 68 measured along the air outlet 34 of the fan 1, X is greater than Y.

Of the plurality of fins 51 of the heat sink 5, the fins 51 which overlap with the fan 1 when viewed in a direction perpendicular to the air outlet 34 dissipate heat through air blown from the fan 1. Meanwhile, of the plurality of fins 51 of the heat sink 5, the fins 51 which do not overlap with the fan 1 when viewed in the direction perpendicular to the air outlet 34 dissipate heat through an air current generated by another fan in a server or a PC. That is, heat dissipation efficiency of the heat module 100 is increased.

Each of the plurality of fins 51 is arranged to extend in the direction perpendicular to the air outlet 34. The fins 51 include a first fin group 52 made up of a plurality of fins 51 which are arranged opposite to the air outlet 34, and a second fin group 53 made up of a plurality of fins 51 which are not arranged opposite to the air outlet 34. In a plan view, the dimension A of the first fin group 52 measured in the direction perpendicular to the air outlet 34 is greater than the dimension B of the second fin group 53 measured in the direction perpendicular to the air outlet 34.

Since the first fin group 52 is arranged immediately outside of the air outlet 34, an air current generated by the fan 1 enters into the first fin group 52 before the velocity of the air current decreases greatly, accomplishing forced cooling of the first fin group 52. Meanwhile, the air current generated by the other fan in the server or the PC enters into the second fin group 53 after the velocity of the air current decreases significantly. Accordingly, to reduce channel resistance, the aforementioned dimension of the second fin group 53 is arranged to be smaller than the aforementioned dimension of the first fin group 52. Thus, the air current which enters into the second fin group 53 passes through the second fin group 53 with only a limited reduction in the velocity of the air current. Thus, an air current passes each fin effectively, and a reduction in the weight of the heat module 100 can be achieved while maintaining the cooling performance.

The two heat pipes 63 are arranged to extend side by side along the direction perpendicular to the air outlet 34 from the fan mount portion 68. On the heat sink mount portion 67, end portions of the heat pipes 63 near the heat sink 5 are arranged to extend in mutually opposite directions along the air outlet 34.

Since a portion of each heat pipe 63 is arranged to extend from the heat source 8 to the heat sink 5 along a path where the portion of the heat pipe 63 can be forcibly cooled, high cooling performance can be exhibited. In addition, since the heat pipes 63 are arranged to extend over the whole area of the heat transfer member 6, heat of the heat source 8 is transferred all over the heat transfer member 6, and effects of both natural cooling and forced cooling can be achieved to exhibit high heat dissipation performance.

The thermally conductive member 9 includes a lead wire accommodating portion 91 in which a portion of the lead wire 212 drawn out of the fan 1 through the lower plate portion 33 is accommodated below the upper surface of the thermally conductive member 9. According to the first preferred embodiment, the lead wire accommodating portion 91 is defined by a cut. Note that the lead wire accommodating portion 91 may alternatively be defined by a groove or a through hole. Also note that the lead wire 212 may be defined by a flexible printed circuit (FPC) board defined integrally with the circuit board 211.

Provision of the lead wire accommodating portion 91 in the thermally conductive member 9 makes it possible to arrange the heat transfer member 6 to be in close contact with the lower plate portion 33, thereby reducing the thermal resistance between the heat source 8 and the fan 1 to improve the heat dissipation performance. If no lead wire accommodating portion 91 were provided, a portion of the lead wire 212 would be held between the thermally conductive member 9 and the lower plate portion 33, making it impossible to arrange the heat transfer member 6 and the fan 1 to be in close contact with each other.

The side wall portion 32 includes the tongue portion (not shown) arranged to project between the air outlet 34 and the impeller 4 of the fan 1. Note that the first fin group 52 may be displaced along the air outlet 34 of the fan 1 toward an opposite side of the central axis J1 with respect to the tongue portion (not shown), with a portion of the second fin group 53 overlapping with the tongue portion (not shown) when viewed in a direction leading from the fan 1 toward the heat sink 5.

Figure 5:
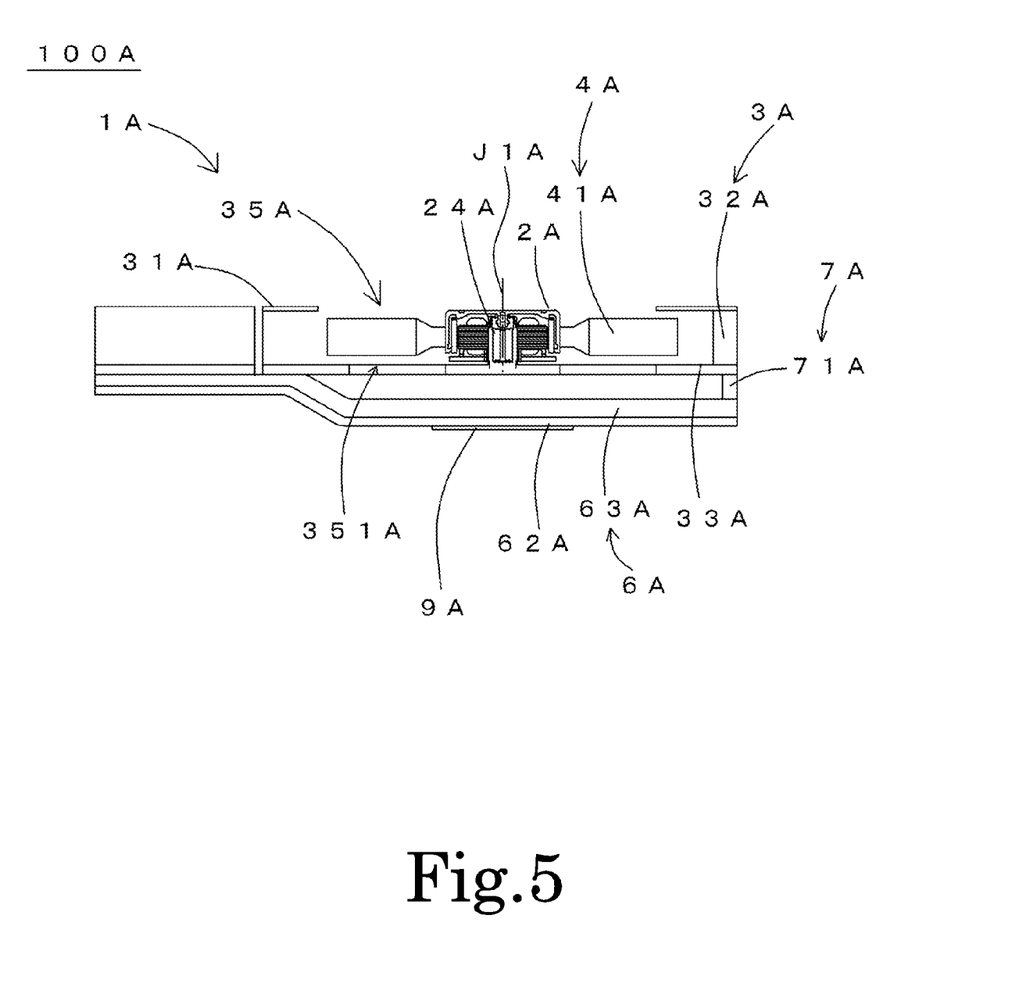
FIG. 5 is a cross-sectional view of a heat module 100A according to a second preferred embodiment of the present invention.

FIG. 5 is a cross-sectional view of a heat module 100A according to a second preferred embodiment of the present invention. The basic structure of the heat module 100A according to the second preferred embodiment is identical to the basic structure of the heat module 100 according to the first preferred embodiment. Accordingly, a description of the second preferred embodiment will be limited to differences from the first preferred embodiment.

A plurality of connection portions 7A include projecting portions 71A arranged to project axially downward from a side wall portion 32A or a lower plate portion 33A. A lower surface of each projecting portion 71A is arranged to be in contact with an upper surface of a heat transfer member 6A. According to the second preferred embodiment, the heat transfer member 6A includes two heat pipes 63A and a base portion 62A arranged below the heat pipes 63A. Thus, the lower surface of each projecting portion 71A abuts on an upper surface of one of the heat pipes 63A. Note that, as described below, in the case where the heat transfer member 6A is made up of only the base portion 62A, the lower surface of each projecting portion 71A is arranged to be in contact with an upper surface of the base portion 62A. Note that each projecting portion 71A may be defined integrally with a lower end of the side wall portion 32A. Also note that each projecting portion 71A may alternatively be defined integrally with the lower plate portion 33A. The projecting portions 71A are arranged radially outward of an inner circumferential surface of the side wall portion 32A, and are spaced from one another in the circumferential direction.

Since the lower surface of each projecting portion 71A is arranged to be in contact with the upper surface of the heat transfer member 6A, precision of the dimension of an axial gap between the heat transfer member 6A and a blower fan 1A can be improved.

According to the second preferred embodiment, a housing 3A includes an upper air inlet 35A and a lower air inlet 351A. An upper plate portion 31A includes the upper air inlet 35A. As with the fan 1 according to the first preferred embodiment, the upper air inlet 35A is arranged above an impeller 4A, and is arranged to pass through the upper plate portion 31A in the vertical direction. The upper air inlet 35A is arranged to axially overlap with at least a portion of a motor 2A or the entire motor 2A. The upper air inlet 35A is substantially circular, and a central axis J1A passes therethrough.

The lower plate portion 33A includes the lower air inlet 351A, which is arranged radially inward of outer edges of a plurality of blades 41A in a plan view, and which is arranged to pass through the lower plate portion 33A in the axial direction. The lower air inlet 351A is substantially annular, and is arranged to pass through the lower plate portion 33A in the vertical direction. The lower air inlet 351A is arranged radially outward of a bearing holding portion 24A. A radially inner edge of the lower air inlet 351A is an edge of a substantially annular surface facing radially outward. Meanwhile, a radially outer edge of the lower air inlet 351A is an edge of a substantially annular surface facing radially inward.

When a thermally conductive member 9A is arranged between the heat transfer member 6A and the lower plate portion 33A such that the thermally conductive member 9A is in direct contact with both the heat transfer member 6A and the lower plate portion 33A, heat can be efficiently transferred from a heat source 8A to the fan 1A. Meanwhile, provision of the lower air inlet 351A in the lower plate portion 33A allows an air current passing through the lower air inlet 351A into the fan 1A to pass around the thermally conductive member 9A, and thus, the thermally conductive member 9A is forcibly cooled not only by the heat being transferred therefrom to the fan 1A but also by air sucked into the fan 1A while the heat is transferred to the fan 1A. Thus, the heat module 100A is able to exhibit high cooling performance.

The diameter of the lower air inlet 351A is greater than the combined width of the two heat pipes 63A. Both widthwise ends of the two heat pipes 63A are included in the lower air inlet 351A in a plan view.

The above arrangements allow an air current which enters into the fan 1A through the upper air inlet 35A or the lower air inlet 351A to flow through an axial space between the heat pipes 63A and the lower plate portion 33A. That is, the air current flows over the upper surfaces of the heat pipes 63A. This causes air staying on a surface of each heat pipe 63A to move, leading to an improvement in a heat dissipation effect produced by the heat pipes 63A.

The area of an opening of the lower air inlet 351A is smaller than the area of an opening of the upper air inlet 35A.

In the fan 1A including the upper air inlet 35A and the lower air inlet 351A, the lower plate portion 33A is arranged to support the bearing holding portion 24A radially inside of the lower air inlet 351A, and therefore, the area of the opening of the lower air inlet 351A is smaller than the area of the opening of the upper air inlet 35A. Accordingly, the amount of air sucked in through the lower air inlet 351A is smaller than the amount of air sucked in through the upper air inlet 35A.

Figure 6:
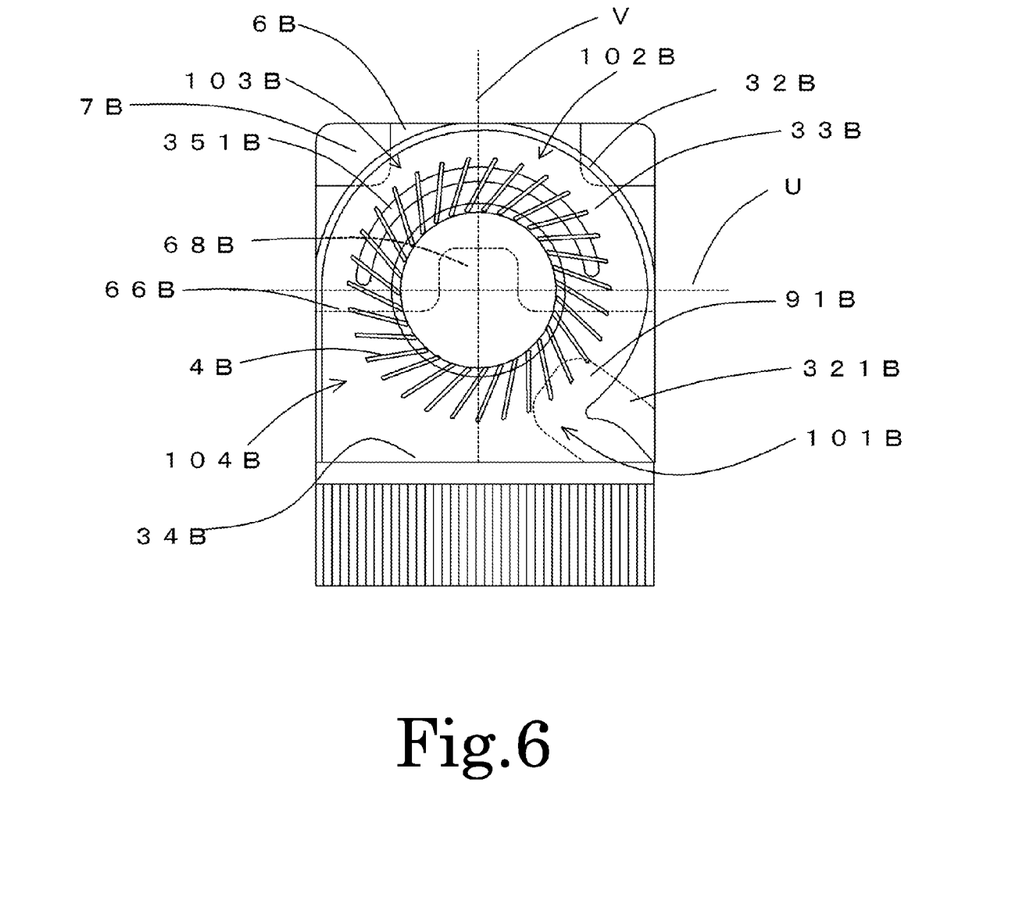
FIG. 6 is a top view of a heat module 100B according to a third preferred embodiment of the present invention with an upper plate portion 31 removed therefrom.
Figure 7:
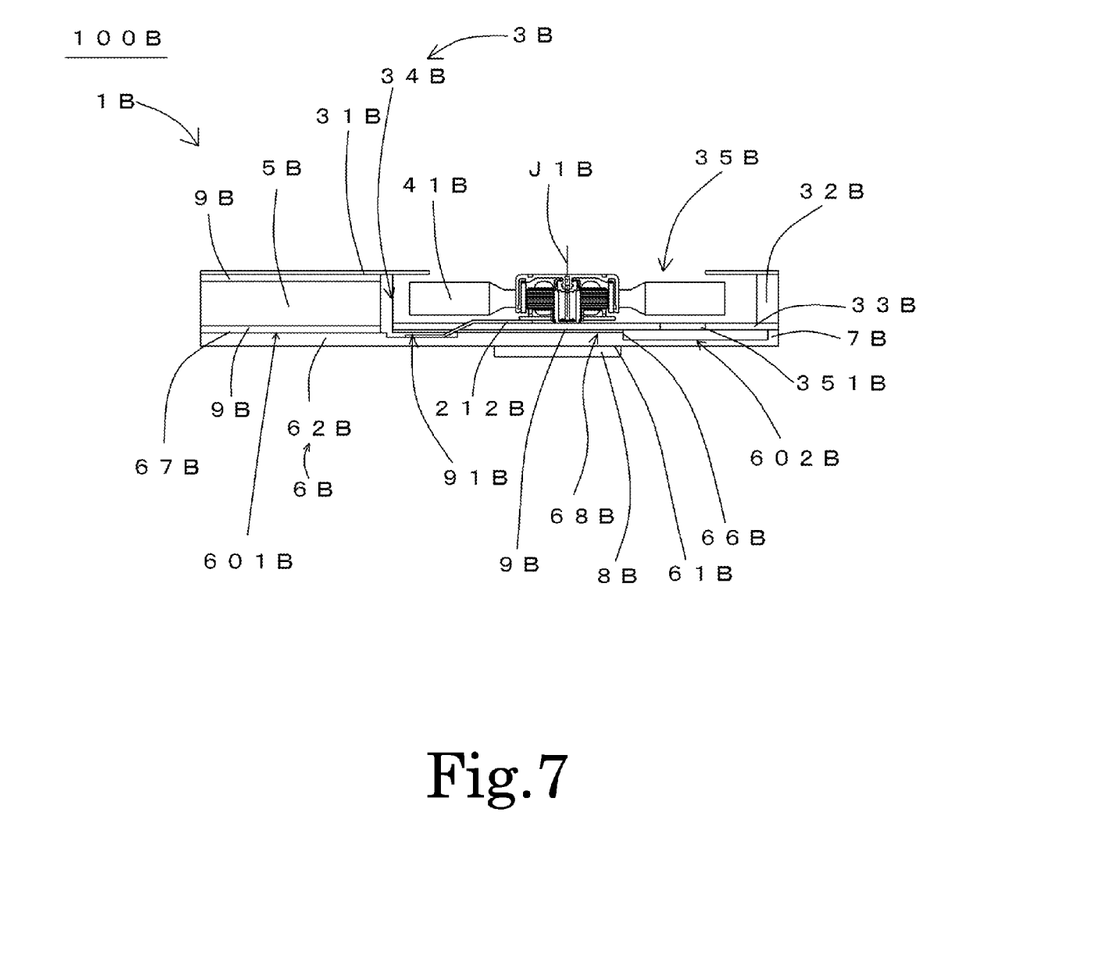
FIG. 7 is a cross-sectional view of the heat module 100B according to the third preferred embodiment of the present invention.

FIG. 6 is a top view of a heat module 100B according to a third preferred embodiment of the present invention. FIG. 7 is a cross-sectional view of the heat module 100B according to the third preferred embodiment of the present invention. The basic structure of the heat module 100B according to the third preferred embodiment is identical to the basic structure of the heat module 100 according to the first preferred embodiment. Accordingly, a description of the third preferred embodiment will be limited to differences from the first preferred embodiment.

Referring to FIGS. 6 and 7, an upper plate portion 31B, a side wall portion 32B, and a lower plate portion 33B are arranged to together define an air outlet 34B on a lateral side of an impeller 4B. The air outlet 34B is a plane parallel to a central axis J1B and including one of an edge of the upper plate portion 31B, a pair of edges which are circumferential ends of an opening of the side wall portion 32B, and an edge of the lower plate portion 33B that is the closest to the central axis J1B. The side wall portion 32B includes a tongue portion 321B arranged to project between the air outlet 34B and the impeller 4B. In a plan view, an imaginary straight line which is parallel to the air outlet 34B and which intersects with the central axis J1B is defined as a first imaginary straight line U. An imaginary straight line which is perpendicular to the air outlet 34B and which intersects with the central axis J1B is defined as a second imaginary straight line V. Of four regions divided by the first and second imaginary straight lines U and V, a region in which the tongue portion 321B is arranged is defined as a first region 101B, and the three other regions are defined as a second region 102B, a third region 103B, and a fourth region 104B in an order in which the three regions are arranged in a rotation direction of the impeller 4B from the first region 101B. Connection portions 7B are arranged in the second region 102B and the third region 103B. According to the third preferred embodiment, each connection portion 7B is included in a heat transfer member 6B.

Referring to FIG. 7, according to the third preferred embodiment, the upper plate portion 31B is arranged to cover an upper side of a heat sink 5B. A thermally conductive member 9B is arranged between an upper surface of the heat sink 5B and a lower surface of the upper plate portion 31B to establish thermal connection between the heat sink 5B and the upper plate portion 31B. The thermally conductive member 9B is made of a plastic material, such as, for example, a thermal grease. Heat is transferred from a heat source 8B to the upper plate portion 31B, and the heat is diffused, resulting in an improvement in cooling performance. Note that the thermally conductive member 9B may alternatively be arranged to establish thermal connection between the upper surface of the heat sink 5B and a cover of a case of a PC, an SSD, or the like, instead of between the upper surface of the heat sink 5B and the upper plate portion 31B.

The heat transfer member 6B is made up of only a base portion 62B. That is, a lower surface of the base portion 62B includes a heat source contact portion 61B capable of being in thermal contact with the heat source 8B, while an upper surface of the base portion 62B includes a heat sink mount portion 67B and a fan mount portion 68B.

According to the third preferred embodiment, the heat sink 5B and a housing 3B are defined by separate members. Note that the heat sink 5B may alternatively be defined integrally with the housing 3B. In more detail, the heat sink 5B is arranged inside the upper plate portion 31B, the side wall portion 32B, and the lower plate portion 33B, and may be defined integrally with the lower plate portion 33B. In this case, the heat sink 5B is made of aluminum, and is molded by die casting.

The lower plate portion 33B is arranged to be in thermal connection with the heat transfer member 6B through another thermally conductive member 9B made of a plastic material. According to the third preferred embodiment, the lower plate portion 33B includes a lower air inlet 351B. The lower air inlet 351B is arranged in the second region 102B and the third region 103B and radially inward of outer edges of a plurality of blades 41B. In addition, the lower air inlet 351B is arranged in an area which does not overlap with the fan mount portion 68B in the lower plate portion 33B. Note that the lower air inlet 351B may not necessarily be arranged in the second region 102B and the third region 103B. For example, portions of the lower air inlet 351B may be arranged in the first region 101B, the second region 102B, and the third region 103B. Also note that two lower air inlets 351B may be provided, and the two lower air inlets 351B may be arranged in the second region 102B and the third region 103B, respectively.

Since the thermally conductive member 9B is arranged between the heat transfer member 6B and the lower plate portion 33B such that the thermally conductive member 9B is in direct contact with both the heat transfer member 6B and the lower plate portion 33B, heat is efficiently transferred from the heat source 8B to a fan 1B. Meanwhile, provision of the lower air inlet 351B in the lower plate portion 33B enables an air current to pass through the lower air inlet 351B into the fan 1B and pass around the thermally conductive member 9B, and thus, the thermally conductive member 9B is forcibly cooled not only by the heat being transferred therefrom to the fan 1B but also by air sucked into the fan 1B before the heat reaches the fan 1B. Thus, the heat module 100E is able to exhibit high cooling performance.

The heat transfer member 6B includes a first upper surface 601B on which the heat sink 5B is arranged, and a second upper surface 602B arranged at a level lower than that of the first upper surface 601B. The second upper surface 602B is arranged in the second region 102B and the third region 103B. The first upper surface 601B and the second upper surface 602B are joined to each other through a shoulder portion 66B. That is, the first upper surface 601B includes an upper surface of the heat sink mount portion 67B of the heat transfer member 6B and an upper surface of the fan mount portion 68B between the central axis J1B and the heat sink 5B, and the heat sink mount portion 67B and the fan mount portion 68B are arranged to be flush with each other. Note that, in the case where the heat sink 5B and the lower plate portion 33B are defined by a single monolithic member, the lower plate portion 33B includes a lower plate of the heat sink 5B. In this case, the first upper surface 601B is an upper surface arranged to be in thermal connection with a lower surface of the heat sink 5B through the thermally conductive member 9B. Because the thermally conductive member 9B has a high thermal conductivity and an excellent heat dissipation characteristic, the heat is easily transferred from the heat transfer member 6B to the lower plate portion 33B with the thermally conductive member 9B being arranged between the lower plate portion 33B and the heat transfer member 6B, even in the case where the shoulder portion 66B is provided.

Air discharged through the air outlet 34B of the fan 1B enters into the heat sink 5B. Meanwhile, provision of the shoulder portion 66B prevents the air discharged out of the fan 1B from traveling to the lower air inlet 351B of the fan 1B. If a loop were formed from the air outlet 34B to the lower air inlet 351B of the fan 1B, the amount of air supplied to an area from which heat is to be dissipated would be reduced, leading to a reduction in cooling performance. Meanwhile, the provision of the shoulder portion 66B enables wind to efficiently strikThw the heat sink 5B, from which heat is to be dissipated, making it possible to exhibit high heat dissipation performance.

The portion of the first upper surface 601B which lies in the first region 101B or the fourth region 104B of the thermally conductive member 9B includes a lead wire accommodating portion 91B in which a portion of the lead wire 212B drawn out of the fan 1B through the lower plate portion 33B is accommodated below an upper end surface of the thermally conductive member 9B.

Provision of the lead wire accommodating portion 91B in the heat transfer member 6B makes it possible to arrange the heat transfer member 6B to be in close contact with the lower plate portion 33B, thereby reducing thermal resistance between the heat source 8B and the fan 1B to improve the heat dissipation performance. If no lead wire accommodating portion 91B were provided, a portion of the lead wire 212B would be held between the heat transfer member 6B and the lower plate portion 33B, making it impossible to arrange the heat transfer member 6B and the fan 1B to be in close contact with each other.

Figure 8:
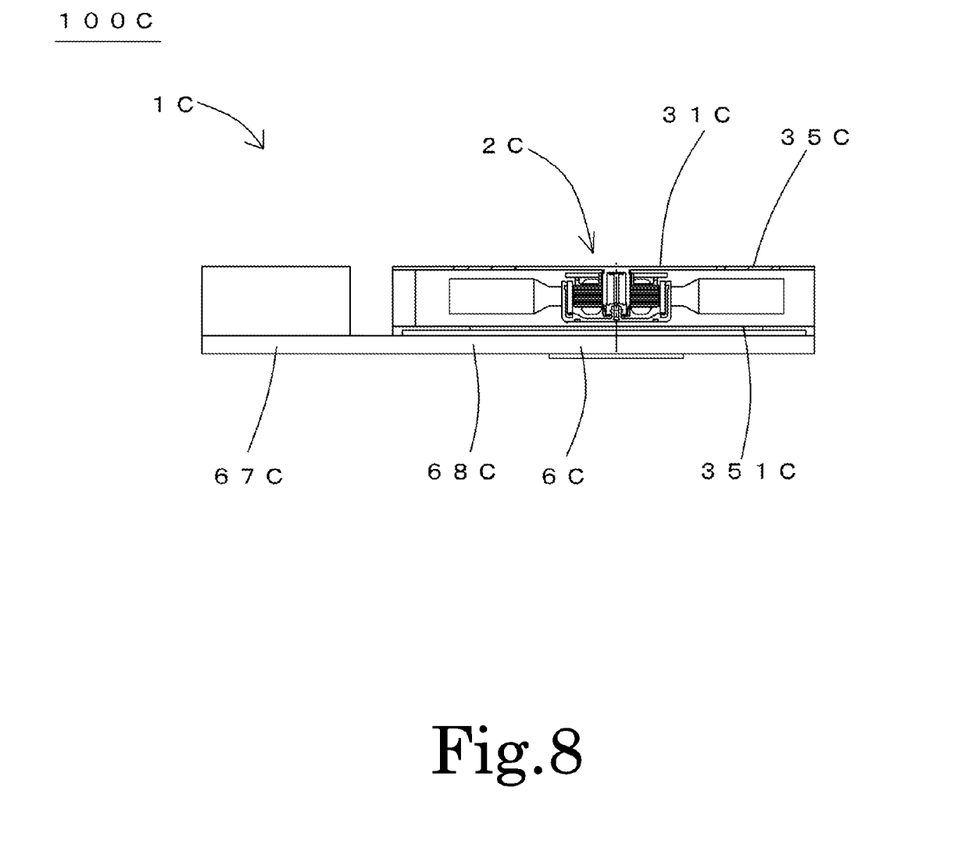
FIG. 8 is a cross-sectional view of a heat module 100C according to an example modification of the first preferred embodiment of the present invention.

FIG. 8 is a cross-sectional view of a heat module 100C according to an example modification of the first preferred embodiment of the present invention. The basic structure of the heat module 100C according to the example modification is identical to the basic structure of the heat module 100 according to the first preferred embodiment. Accordingly, a description of the example modification will be limited to differences from the first preferred embodiment.

According to the example modification, a heat transfer member 6C includes no shoulder portion 66C. Accordingly, an upper surface of the heat transfer member 6C is flat. In other words, the axial height of a heat sink mount portion 67C and the axial height of a fan mount portion 68C are identical to each other.

According to this modification, a motor 2C is fixed to an upper plate portion 31C. That is, compared to the motor 2 according to the first preferred embodiment, the motor 2C is turned upside down, and is fixed to the upper plate portion 31C in this upside-down orientation. Even in this case, the area of an opening of a lower air inlet 351C is arranged to be smaller than the area of an opening of an upper air inlet 35C.

Centrifugal fans according to preferred embodiments of the present invention are usable to cool devices inside cases of notebook PCs and desktop PCs, to cool other devices, to supply air to a variety of objects, and so on. Moreover, centrifugal fans according to preferred embodiments of the present invention are also usable for other purposes.

What is claimed is:

1. A heat module comprising:
a fan including:
an impeller including a plurality of blades arranged in a circumferential direction about a central axis extending in a vertical direction;
a motor arranged to rotate the impeller; and
a housing arranged to accommodate the impeller and the motor, and including an upper plate portion including an upper air inlet arranged axially above the impeller, a side wall portion fixed to a lower surface of the upper plate portion and including an air outlet passing through the side wall portion and facing radially outward, and a lower plate portion fixed to a lower portion of the side wall portion;
a heat sink including a plurality of fins, and arranged radially outside of the air outlet;
a heat transfer member including a lower surface capable of being in thermal contact with a heat source, and an upper surface thermally connected to the heat sink, and arranged to overlap with at least a portion of the fan in a plan view; and
a plurality of connection portions arranged between the heat transfer member and the housing to define an axial gap between an upper surface of the heat transfer member and a lower surface of the lower plate portion; wherein
the heat transfer member includes a heat source contact portion arranged on a side, closer to the fan, of an end portion of the fan at which the air outlet is defined,
wherein the connection portions comprise seating surface portions, each of which is arranged to project axially upward from the heat transfer member; wherein the fan is arranged on the seating surface portions,
wherein the connection portions are arranged radially outward an inner circumferential surface of the side wall portion.

2. The heat module according to claim 1, wherein the plurality of connection portions include projecting portions arranged to project axially downward from the side wall portion or the lower plate portion, and arranged to be in contact with the upper surface of the heat transfer member.

3. The heat module according to claim 1, wherein
the heat transfer member includes a heat sink mount portion arranged to axially overlap with the heat sink, and a fan mount portion arranged to axially overlap with the fan; and
in a plan view, a dimension of the heat sink mount portion measured along the air outlet of the fan is greater than a dimension of the fan mount portion measured along the air outlet of the fan.

4. The heat module according to claim 3, wherein
each of the plurality of fins is arranged to extend in a direction perpendicular to the air outlet, and the plurality of fins include a first fin group made up of a plurality of fins which are arranged opposite to the air outlet, and a second fin group made up of a plurality of fins which are not arranged opposite to the air outlet; and
in the plan view, a dimension of the first fin group measured in the direction perpendicular to the air outlet is greater than a dimension of the second fin group measured in the direction perpendicular to the air outlet.

5. The heat module according to claim 1, wherein the lower plate portion includes a lower air inlet arranged to pass therethrough in an axial direction, and arranged radially inward of outer edges of the plurality of blades in a plan view.

6. The heat module according to claim 1, wherein the heat transfer member includes a base portion including the heat source contact portion in a lower surface thereof, and a heat pipe including a portion arranged axially above the base portion, arranged to be in thermal contact with the heat source contact portion, and arranged to extend toward the heat sink.

7. The heat module according to claim 6, wherein
the heat transfer member includes a heat sink mount portion arranged to axially overlap with the heat sink, and a fan mount portion arranged to axially overlap with the fan;
two heat pipes are provided, the two heat pipes extending side by side along a direction perpendicular to the air outlet from the fan mount portion; and
on the heat sink mount portion, end portions of the two heat pipes near the heat sink are arranged to extend in mutually opposite directions along the air outlet.

8. The heat module according to claim 7, wherein
the lower plate portion includes a lower air inlet arranged to pass therethrough in an axial direction, and arranged radially inward of outer edges of the plurality of blades in a plan view; and
a diameter of the lower air inlet is greater than a combined width of the two heat pipes, and both widthwise ends of the two heat pipes are included in the lower air inlet in the plan view.

9. The heat module according to claim 8, wherein an area of an opening of the lower air inlet is smaller than an area of an opening of the upper air inlet.

10. The heat module according to claim 1, wherein
the plurality of connection portions include projecting portions arranged to project from the side wall portion axially downward beyond the lower plate portion;
the heat transfer member includes a base portion including the heat source contact portion in a lower surface thereof, and a heat pipe arranged axially above the base portion;
the base portion includes raised portions each of which includes a bend portion being bent axially upward, and a seating surface portion arranged to extend from an upper end of the bend portion in a direction perpendicular to an axial direction; and
each raised portion is joined to a lower surface of a separate one of the plurality of connection portions.

11. The heat module according to claim 10, wherein
the heat transfer member includes a heat sink mount portion arranged to axially overlap with the heat sink, and a fan mount portion arranged to axially overlap with the fan;
two heat pipes are provided, the two heat pipes extending side by side along a direction perpendicular to the air outlet from the fan mount portion; and
on the heat sink mount portion, end portions of the two heat pipes near the heat sink are arranged to extend in mutually opposite directions along the air outlet.

12. The heat module according to claim 11, wherein
the lower plate portion includes a lower air inlet arranged to pass therethrough in the axial direction, and arranged radially inward of outer edges of the plurality of blades in a plan view; and a diameter of the lower air inlet is greater than a combined width of the two heat pipes, and both widthwise ends of the two heat pipes are included in the lower air inlet in the plan view.

13. The heat module according to claim 12, wherein an area of an opening of the lower air inlet is smaller than an area of an opening of the upper air inlet.

14. The heat module according to claim 1, wherein a dimension of the axial gap between the upper surface of the heat transfer member and the lower surface of the lower plate portion is smaller than a maximum thickness of the heat transfer member.

15. The heat module according to claim 1, wherein the heat transfer member includes, between the central axis and the heat sink, a shoulder portion which is higher on a side closer to the heat sink.

16. The heat module according to claim 1, further comprising a thermally conductive member arranged to establish thermal connection between the lower plate portion and the heat transfer member.

17. The heat module according to claim 16, wherein the heat transfer member is defined by a metal sheet.

18. The heat module according to claim 16, wherein
the motor includes a stationary portion fixed to the lower plate portion, and a rotating portion supported to be rotatable with respect to the stationary portion;
the stationary portion includes an armature, a circuit board electrically connected to the armature, and a lead wire arranged to supply power to the circuit board; and
the thermally conductive member includes a lead wire accommodating portion in which a portion of the lead wire drawn out of the fan through the lower plate portion is accommodated below an upper surface of the thermally conductive member.

19. The heat module according to claim 18, wherein the thermally conductive member is made of a plastic material.

20. The heat module according to claim 1, wherein
the upper plate portion, the side wall portion, and the lower plate portion are arranged to together define the air outlet on a lateral side of the impeller;
the air outlet is a plane parallel to the central axis and including one of an edge of the upper plate portion, a pair of edges which are circumferential ends of an opening of the side wall portion, and an edge of the lower plate portion that is the closest to the central axis;
the side wall portion includes a tongue portion arranged to project between the air outlet and the impeller;
an imaginary straight line which is parallel to the air outlet and which intersects with the central axis in a plan view is defined as a first imaginary straight line, and an imaginary straight line which is perpendicular to the air outlet and which intersects with the central axis in the plan view is defined as a second imaginary straight line;
of four regions divided by the first and second imaginary straight lines, a region in which the tongue portion is arranged is defined as a first region, and the three other regions are defined as a second region, a third region, and a fourth region in an order in which the three regions are arranged in a rotation direction of the impeller from the first region; and
the connection portions are arranged in the second region and the third region.

21. The heat module according to claim 20, wherein
the lower plate portion includes a lower air inlet arranged to pass therethrough in an axial direction, and arranged radially inward of outer edges of the plurality of blades in a plan view;
the heat transfer member includes a first upper surface on which the heat sink is arranged, a second upper surface arranged at a level lower than that of the first upper surface and arranged in the second region and the third region, and a shoulder portion;
the first and second upper surfaces are joined to each other through the shoulder portion; and
the lower air inlet of the lower plate portion is arranged in the second region or the third region and radially inward of the outer edges of the plurality of blades.

22. The heat module according to claim 21, further comprising a thermally conductive member arranged to establish thermal connection between the lower plate portion and the heat transfer member, wherein
the motor includes a stationary portion fixed to the lower plate portion, and a rotating portion supported to be rotatable with respect to the stationary portion;
the stationary portion includes an armature, a circuit board electrically connected to the armature, and a lead wire arranged to supply power to the circuit board; and
a portion of the first upper surface which lies in the first region or the fourth region of the thermally conductive member includes a lead wire accommodating portion in which a portion of the lead wire drawn out of the fan through the lower plate portion is accommodated below an upper end surface of the thermally conductive member.

23. The heat module according to claim 22, wherein
the heat sink includes the plurality of fins and a heat sink base portion arranged to support the plurality of fins; and
a lower end of each of the plurality of blades is arranged at a level higher than that of an upper surface of the heat sink base portion.

24. The heat module according to claim 23, wherein an upper surface of the lower plate portion is arranged at a level higher than that of an upper surface of the heat sink base portion.

25. The heat module according to claim 1, wherein the heat transfer member is of a metal sheet which comprises the connection portions comprising the seating surface portions, each seating surface portion formed by bending the metal sheet axially upward.

* * * * *